United States Patent [19]

Giammarco et al.

[11] Patent Number: 4,707,218

[45] Date of Patent: Nov. 17, 1987

[54] LITHOGRAPHIC IMAGE SIZE REDUCTION

[75] Inventors: Nicholas J. Giammarco, Newburgh, N.Y.; Alexander Gimpelson, Allston, Mass.; George A. Kaplita, New Windsor, N.Y.; Alexander D. Lopata, Fishkill, N.Y.; Anthony F. Scaduto, Newburgh, N.Y.; Joseph F. Shepard, Hopewell Junction, N.Y.

[73] Assignee: International Business Machines Corporation, Armonk, N.Y.

[21] Appl. No.: 924,223

[22] Filed: Oct. 28, 1986

[51] Int. Cl.[4] .................. H01L 21/306; B44C 1/22; C03C 15/00; C03C 25/06

[52] U.S. Cl. .................. 156/643; 156/644; 156/646; 156/648; 156/657; 156/659.1; 156/661.1; 156/662; 156/653; 427/43.1; 428/137; 430/5; 430/313

[58] Field of Search .............. 156/643, 644, 646, 648, 156/653, 657, 659.1, 662, 661.1; 430/5, 313; 427/43.1; 428/131, 137

[56] References Cited

U.S. PATENT DOCUMENTS

| | | | |
|---|---|---|---|
| 4,209,349 | 6/1980 | Ho et al. | 148/187 |
| 4,358,340 | 11/1982 | Fu | 156/643 |
| 4,419,809 | 12/1983 | Riseman et al. | 29/571 |
| 4,419,810 | 12/1983 | Riseman et al. | 29/571 |
| 4,462,846 | 7/1984 | Varshney | 148/33.2 |
| 4,502,914 | 3/1985 | Trumpp et al. | 156/643 |
| 4,529,686 | 7/1985 | Kraus | 156/659.1 X |
| 4,597,826 | 7/1986 | Majima et al. | 156/651 X |
| 4,599,790 | 7/1986 | Kim et al. | 29/571 |
| 4,636,281 | 1/1987 | Buiguez et al. | 156/643 |

Primary Examiner—William A. Powell
Attorney, Agent, or Firm—T. Rao Coca

[57] ABSTRACT

Disclosed is a process for reducing lithographic image size for integrated circuit manufacture. A mask of photosensitive material having an opening of a minimum size dictated by the limits of lithography is formed on a substrate. Reduction in the image size is achieved by establishing sidewalls to the interior vertical surfaces of the opening by depositing a conformal layer, followed by anisotropic etching. The dimension of the opening is reduced by the combined thickness of the two opposite insulator sidewalls.

In a specific direct application of the disclosed process, a photomask/stencil having a pattern of openings of a minimum size smaller than possible by lithography, per se, is formed.

20 Claims, 5 Drawing Figures

LITHOGRAPHIC IMAGE SIZE REDUCTION

BACKGROUND OF THE INVENTION

The invention relates to a method of reducing lithographic image size for integrated circuit (IC) manufacture. More particularly, it is a method of forming a mask having openings of a size smaller than obtainable by lithography.

There has been an inexorable advance in IC industry due to the insatiable appetite for scaling down the devices. Scaling device dimensions reduces cost of manufacture while increasing the performance (speed). While this advance can be attributed to new processing techniques such as replacement of wet etching by dry etching (plasma etching, reactive ion etching and ion milling), use of low-resistivity silicides and refractory metals as replacements for high-resistivity polysilicon interconnections, multiple-resists to compensate for wafer surface variations that thwart accurate fine-line lithography, laser and electron-beam processing to purify and reduce defects in materials, nonoptical methods of inspecting line widths and layer-to-layer registration to replace optical methods incapable of measuring these parameters at low-micrometer levels, lithography has been the driving force behind each step forward. Improved lithographic tools such as 1:1 optical projection systems fitted with deep-ultraviolet source and optics, electron-beam, direct-step-on-wafer, and X-ray and ion-beam systems and improved photoresist materials and processes such as multilayer resist utilizing a top resist sensitized to X-ray or electron-beam and bottom straight optical resist layer(s) are some of the components of this driving force.

Despite this tremendous progress, there remains an ever-growing need for reduction of image sizes over and beyond that offered by enhancements to lithographic tools, materials and processes, per se. However, the prior art has not been able to meet this need.

The invention precisely satisfies this need for reducing lithographic image sizes by extending lithographic resolution to smaller sizes than capable by lithography.

SUMMARY OF THE INVENTION

In its broadest form, the invention provides a method of reducing the size of a lithographic image by establishing a sidewall on the interior of the opening in the lighographic mask material used to obtain the image. In a specific embodiment, the invention presents a process for making a mask having openings of a size smaller than obtainable by lithography. Starting with a substrate (e.g., semiconductor, insulator or metal), a thin release layer of an insulator material, such as photoresist and silicon dioxide, is formed on the substrate. A thick layer of photosensitive material is then applied. The thick layer is patterned by lithographic means to have openings of a minimum size dictated by limits of lighography. Thereafter, to further reduce the size of the openings, a conformal layer material is applied to the patterned photosensitive layer and the substrate portions exposed by the openings in the patterned layer. The thickness of the conformal layer material is determined by the desired reduction in the size of the openings. For example, for an elongated opening, the reduction in the width of the opening is approximately twice the thickness of the conformal layer. An example of the conformal layer material is $Si_xO_y$ formed by plasma-deposited hexamethyldisilazane (HMDS). By directional reactive ion etching (RIE), the conformal layer is removed from all the horizontal surfaces leaving sidewalls of the conformal layer material on the non-horizontal surfaces corresponding to the openings in the photosensitive material. The release layer exposed by the openings in the photosensitive material is also removed by RIE. The thick photosensitive mask in combination with the sidewalls of the conformal layer material constitute a new mask (stencil) having openings smaller than obtainable by lithography alone. This new mask can be used for a variety of purposes including ion implantation to implant the substrate exposed by the reduced-dimensioned openings therein, as a RIE mask to etch narrow trenches in the substrate, as an oxidation mask to form recessed oxide isolation in the exposed regions of the semiconductor substrate, as a contact or metallization mask to respectively establish narrow dimensioned contacts to or conductors on the substrate, etc. Following such use, the new mask is lifted off the substrate by subjecting the release layer to a wet etchant.

To form narrow and deep trenches in a semiconductor substrate, the above mask forming process is modified by starting with a semiconductor substrate having thereon a thick insulator layer such as photoresist or polyimide. The new mask as described above is formed on the thick insulator, after which the thick insulator layer is patterned by RIE using the new mask as an RIE mask. Following the liftoff of the release layer, the patterned thick insulator layer on the substrate will serve as a trench RIE mask for etching deep trenches having a width smaller than the lithography limit in the semiconductor material.

BRIEF DESCRIPTION OF THE DRAWINGS

The novel features, process steps and their combination characteristic of the invention are set forth in the appended claims. The invention itself, however, will be best understood by reference to the detailed description which follows in conjunction with the accompanying drawings, wherein:

DETAILED DESCRIPTION OF THE PREFERRED EMBODIMENTS

Now referring to the process steps illustrated in FIGS. 1–4, the process is initiated starting with a substrate 10. The substrate 10 may be any material on which a photoactive layer can be coated and patterned by lithographic techniques. For example, the substrate 10 may be a semiconductor material, glass, insulator, primary photosensitive material, metal or a combination thereof. Next, a release layer 12 is applied to the substrate 10. The release layer 12 is composed of a material that is easily removable from the substrate 10. Such removal is made by wet chemical etchants or by oxygen ashing. Since the basic function of release layer 12 is to facilitate easy removal of itself, any subsequently formed layers/structures thereon are correspondingly removed as well. Examples of the material suitable for forming layer 12 include photoresist. In one example, AZ 1350J (trademark of American Hoechst Corporation) photoresist material is applied by spin coating, followed by baking at a temperature of about 200°-250° C. for about 30-60 mins. to obtain a release layer 12 of about 200-1000 Å thickness. Below about 200 Å thickness, the release layer would be too thin to reliably coat the substrate 10.

Figure 1:
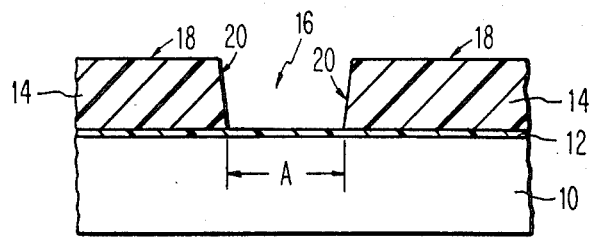
FIGS. 1–4 are sequential cross-sectional representations of one embodiment of a process for forming a mask/stencil having opening(s) smaller than dictated by lithography limit.

Continuing with the present process, after forming the release layer 12, a thick imaging layer 14 of a photosensitive material is applied, for example, by spin-coating as illustrated in FIG. 1. The imaging layer 14 is of a sufficient thickness in the range 0.8-3 microns. An example of the material of layer 14 is AZ 1350J photoresist. After coating the photosensitive material, it is patterned in a desired pattern by pattern-exposing in a lithographic tool, developed, rinsed and dried. For simplicity of illustration, in FIG. 1 a single opening 16 having a lateral dimension A is shown in the layer 14 having a substantially horizontal surface 18 and substantially vertical surfaces 20—20. The dimension A may be the smallest image size that is obtainable by lithography. In other words, the width A may be the smallest dimension that is achievable by pushing lithography (which includes x-ray, electron-beam, etc.) to its highest resolution limit. Next, the patterned photosensitive layer is subjected to a hardening process step to thermally stabilize the layer 14. Deep ultraviolet exposure or heat treatment at a temperature of about 200°-250° C. for about 1-2 mins. may be used for hardening. Another method of hardening the layer 14 is by subjecting it to a halogen gas plasma. This hardening step is needed for conventional photoresists, lest the photosensitive material constituting layer 14 may bubble up, melt and flow or otherwise get degraded during the deposition of subsequent layers thereon.

The next step in the present process is establishing sidewalls on the vertical surfaces 20—20 to reduce the lateral dimension A of the opening 16 beyond that achievable by lithography alone. Sidewall technology is known to the prior art as exemplified by the following patents. U.S. Pat. No. 4,209,349 assigned to the present assignee, utilizes sidewall technology for forming small openings in a mask. According to this method, first insulator regions are formed on a substrate so that horizontal and vertical surfaces are obtained. A second insulator layer is applied thereon of a material different from that of the first layer, and is subjected to RIE in such a manner that the horizontal regions of the second insulator are removed, with merely very narrow regions of this layer remaining on the vertical surface regions of the first insulator, and the respective regions of the substrate, respectively. Subsequently, the exposed substrate regions are thermally oxidized, and for finally forming the desired mask openings the regions of the second insulator layer there are removed. U.S. Pat. No. 3,358,340 describes a method of making submicron devices using sidewall image transfer. A conductive film of submicron thickness is deposited across a vertical step between adjacent surfaces of an isolation, and subsequently vertically etched until there remains only part of the conductive film which is adjacent to the vertical step. The remaining isolation not covered by the conductor is removed, thus obtaining a submicron-wide gate of an MOS field effect transistor. U.S. Pat. Nos. 4,419,809 and 4,419,810 assigned to the present assignee disclose methods of making self-aligned field effect transistors using sidewall to define narrow gates. U.S. Pat. No. 4,462,846 discloses use of sidewalls to minimize birds beak extensions of recessed oxide isolation regions. U.S. Pat. No. 4,502,914 assigned to the present assignee describes a method of making submicron structures by providing a polymeric material structure having vertical walls, the latter serving to make sidewall structure of submicron width. The sidewall structures are directly used as masks. For negative lithography, another layer is applied over the sidewall structures, which is partly removed until the peaks of the sidewall structures are exposed. Subsequently, the sidewall structures themselves are removed and the resulting opening is used as a mask opening for fabricating integrated circuit devices.

Figure 2:
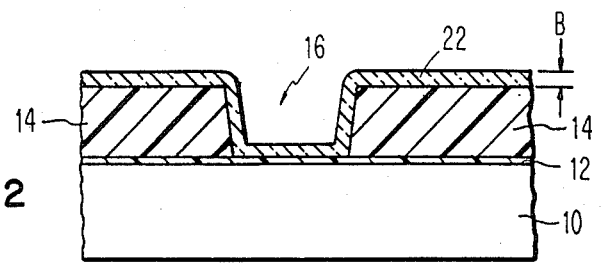

To reduce the size of the opening 16 in the layer 14, referring to FIG. 2, a conformal layer 22 is formed over the patterned photosensitive layer 14 and the portion of the release layer 12 exposed by the opening 16 therein. The conformal layer material may be polysilicon, $Si_xO_y$, silicon dioxide, silicon nitride, silicon oxynitride or a combination thereof. In general, the conformal layer 22 may be any material which can be deposited at a temperature low enough as to not cause degradation of the patterned photosensitive layer 14. A preferred material for forming layer 22 is $Si_xO_y$ obtained by hexamethyldisilazane (HMDS) plasma deposition.

Figure 3:
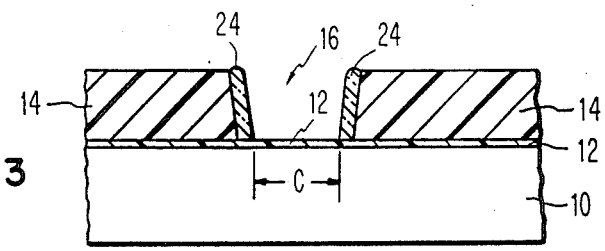

Typically, the layer 22 is formed by mounting the substrate with the structure of FIG. 1 in a plasma deposition system, introducing liquid HMDS into the process chamber and generating the necessary electric field therein which transforms the liquid HMDS into a HMDS plasma. The HMDS plasma will deposit on the structure of FIG. 1 obtaining a conformal and uniform layer 22 of plasma-deposited HMDS having the composition $Si_xO_y$. The thickness B of layer 22 is determined by the desired reduction in the lithographic image size in the photosensitive layer 14. Typically, for very large scale integrated circuit fabrication, the thickness of layer 22 is in the range 0.01-0.6 microns. The lower limit for the thickness of layer 22 is dictated by the requirements of good step coverage associated with the substantially vertical wall profile 20 in layer 14 and viability of the layer 22 as a thin film. The upper limit for the thickness of layer 22 is determined by the desired percentage reduction in the size of the opening 16 in the layer 14. The percentage reduction in the opening size is governed by the factor 2B/A. In other words, if the size of the opening is 3 microns, in order to achieve a 66.6% reduction in the size of the hole 16 (or an actual reduction of the hole size to 1 micron), a 1 micron thick HMDS layer 22 is deposited. After forming the conformal layer 22, next by anisotropic etching it is removed from all the substantially horizontal surfaces leaving it only on the substantially vertical surfaces of layer 14. RIE may be accomplished by a halogen-containing etchant gas. One suitable etchant gas is CF4. The resulting structure will be as shown in FIG. 3 where the unetched portions of layer 22 are designated by 24, now serving as sidewalls on the vertical surfaces 20 of layer 14. Due to the establishment of the sidewalls 24 on the interior of the vertical surfaces of the opening, the size of the opening 16 is reduced to a new dimension designated as C in FIG. 3. The relationship between the parameters A, B and C is given by: $C = A - 2B$.

Following the establishment of the sidewalls 24 on the vertical surfaces of the opening 16, the portion of the release layer 12 exposed by the reduced-size opening 16 is removed by RIE using, for example, either the same etchant species which facilitated removal of layer 22 from the horizontal surfaces of layer 14 or $O_2$ plasma.

Figure 4:
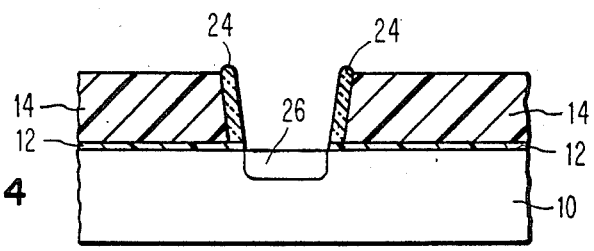

The photosensitive mask in combination with the sidewalls 24 fabricated in this manner constitutes a new mask (or stencil) having openings of a substantially reduced dimension than obtainable by lithography alone. The new mask serves a variety of purposes. As illustrated in FIG. 4, for example, it may be used as an ion implantation mask to implant an extremely narrow/small region 26 of the substrate 10. Another application of the new mask is as an etch mask to etch extremely narrow deep/shallow trenches in the substrate 10. Yet another application is to grow a recessed isolation oxide free of bird's beak and bird's head of a width essentially equal to the dimension C by subjecting the substrate and the overlying stencil structure to a low temperature oxidation. A further use of the new mask is as a contact (liftoff) mask for establishing highly localized electrical contacts to the substrate. Another use of the mask is to form narrow conductor or insulator lines of width C on the substrate.

Once the intended use of the new mask is complete, it is removed from the substrate 10 by taking advantage of the release layer 12. By subjecting the release layer 12 to a suitable etchant for example, a hot oxidizing acid such as nitric acid, sulphuric acid, or hot phenol it is lifted off the surface of the substrate thereby removing the overlying layer 14 and its associated sidewalls 24. Alternatively, the photosensitive layer 14 and the release layer 12 may be removed concurrently by oxygen plasma. Any sidewall material 24 that remains is removed by mechanical means, $CF_4$ plasma etch or washed off in a liquid base.

Figure 5:
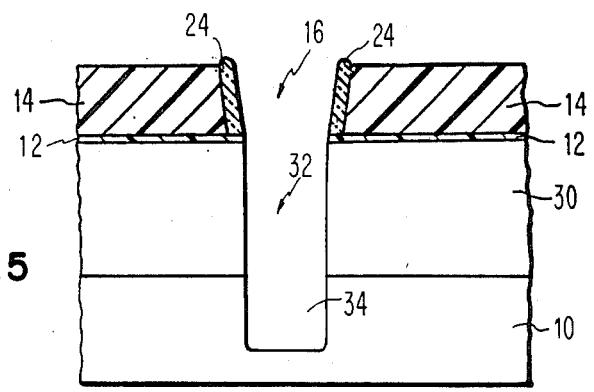
FIG. 5 is s cross-sectional representation of an extension of the process step sequence illustrated in the preceding figures.

Turning to FIG. 5, there is shown in this figure an alternative process of fabricating a nonerodable stencil having openings therein of a size smaller than capable by lithography, per se. In this process, an underlayer 30 is formed between the substrate 10 and the release layer 12. (In this embodiment, the release layer 12 may be omitted.) The underlayer 30 is substantially thicker than the photosensitive material 14. For example, when the substrate material is a semiconductor, the underlayer may be an insulator such as polyimide or photoresist. After forming the stencil precursor comprised of the release layer 12 and the photosensitive layer 14 having sidewalls 24 in the manner described above in conjunction with FIGS. 1-4, the process is modified to anisotropically etch the underlayer 30 to transfer the opening 16 in the layer 14 to the underlayer 30 obtaining the opening 32 therein. When the underlayer is polyimide, this etching is done by using $O_2$ plasma. Following the definition of the nonerodable mask 30, the overlying structure is removed by liftoff of the release layer as previously elaborated in conjunction with FIG. 4 description. The underlayer 30 defined in this manner will serve as a thick nonerodable mask for etching, for example, deep and extremely narrow trenches in the substrate 10. One such trench is shown in FIG. 5 designated by numeral 34. The trench 34 will have near perfect vertical walls owing to the enormous thickness of the nonerodable mask.

Thus, there has been provided in accordance with the invention, a method of reducing lithographic image size that fully satisfies the objects and advantages set forth above. This method permits reduction in lithographic image size over and beyond that possible by improved lithographic resolution brought about by lithography tool enhancements. In other words, this method can be applied universally and for all time to come, to move lithographic image resolution a significant step ahead of improvements due to tool enhancements.

While the invention has been described in conjunction with preferred embodiments, it is evident that many alternatives, modifications and variations will be apparent to those skilled in the art in light of the foregoing description. It is, therefore, contemplated that the appended claims will embrace any such alternatives, modifications and variations as fall within the true scope and spirit of the invention.

What is claimed is:

1. Process for forming a mask having an opening of a size smaller than obtainable by lithography, comprising:
    providing a substrate coated with a photosensitive material;
    patterning the photosensitive material to form an opening therein, said opening having substantially vertical walls and minimum size dictated by resolution limit of lithography;
    forming a conformal layer of a material on the resulting structure including said vertical walls; and
    anisotropically etching said conformal layer to provide said conformal layer material on said vertical walls whereby said size of said opening is reduced.

2. The process as in claim 1 wherein said substrate is selected from a group consisting of semiconductor, insulator and conductor.

3. The process as in claim 1 wherein said substrate is composed of either silicon, glass, metal or a combination thereof.

4. The process as in claim 1 wherein said conformal layer material is silicon dioxide, $Si_xO_y$, silicon nitride, silicon oxynitride or polysilicon.

5. The process as in claim 1 wherein said material is $Si_xO_y$ obtained by plasma deposition of hexamethyldisilazane.

6. The process as in claim 1 wherein said photosensitive material is photoresist.

7. The process as in claim 1 further comprising forming on said substrate a readily removable layer prior to coating with said photosensitive layer.

8. The process as in claim 1 further comprising hardening said photosensitive material prior to forming said conformal layer.

9. The process as in claim 1 wherein the size of said opening is reduced by approximately twice the thickness of said conformal layer.

10. The process as in claim 7 wherein said photosensitive layer is thick compared to the thickness of said removable layer.

11. A process for reducing the size of a lithographic image in a mask material comprising:
    forming on a substrate a mask material having at least one opening of minimum size A determined by the resolution limit of lithographic exposure tooling, said opening having substantially vertical interior walls; and
    establishing sidewalls of a material of a thickness B on said walls, whereby the new size C of said opening is at least approximately $A - 2B$.

12. The process as recited in claim 11 wherein the percentage reduction in the size A of said opening is about $2B/A$.

13. The process as recited in claim 11 wherein said sidewall material has a lower etch rate than that of said substrate enabling said mask material in combination with said sidewalls to function as an etch mask for etching said substrate.

14. The process as recited in claim 11 wherein the step of establishing sidewalls comprises:
    forming a conformal layer of said sidewall material; and
    anisotropically etching to remove said sidewall material from everywhere except the walls of said opening.

15. Process for forming a mask on a substrate surface for integrated circuit manufacture comprising:
    providing a substrate covered with a relatively thick layer of a first material;
    coating said first material with a photosensitive layer having an opening of a minimum size dictated by the resolution limit of lithography, said opening having substantially vertical surfaces;
    depositing a conformal layer of an insulator material on said first material including said vertical surfaces and on the substrate exposed by said opening;
    anisotropically etching to remove said conformal layer from everywhere except said walls of said opening, thereby reducing the size of said opening by approximately twice the thickness of said conformal layer; and
    anisotropically etching said first material layer to transfer thereto an image of said opening of reduced size in said photosensitive layer and transform said first material layer into a mask for said substrate.

16. The process as recited in claim 15 further comprising removing said photosensitive layer and the sidewalls of said conformal layer associated with the opening therein following said etching of said first material.

17. The process as recited in claim 16 further comprising forming a release layer on said first material prior to coating said photosensitive layer to facilitate removal of said photosensitive layer and said associated sidewalls.

18. The process as recited in claim 17 further comprising hardening said photosensitive layer prior to depositing said conformal layer.

19. The process as in claim 18 wherein said conformal layer is plasma-deposited hexamethyldisilazane.

20. The process as in claim 19 further comprising using said mask anisotropically etching said substrate to form an extremely narrow and deep trench of a width equivalent to said reduced size.

* * * * *